(12) United States Patent
De Wilde et al.

(10) Patent No.: US 10,684,113 B2
(45) Date of Patent: Jun. 16, 2020

(54) SNOM DEVICE USING HETERODYNE DETECTION

(71) Applicant: CENTRE NATIONAL DE LA RECHERCHE SCIENTIFIQUE—CNRS—, Paris (FR)

(72) Inventors: Yannick De Wilde, Paris (FR); Lèo Greusard, Auzielle (FR); Gilles Tessier, Paris (FR); Sylvain Gigan, Paris (FR); Samuel Gresillon, Paris (FR); Kamel Bencheikh, Vitry sur Seine (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 100 days.

(21) Appl. No.: 16/068,639

(22) PCT Filed: Jan. 6, 2017

(86) PCT No.: PCT/FR2017/050041
§ 371 (c)(1),
(2) Date: Jul. 6, 2018

(87) PCT Pub. No.: WO2017/118828
PCT Pub. Date: Jul. 13, 2017

(65) Prior Publication Data
US 2019/0041185 A1   Feb. 7, 2019

(30) Foreign Application Priority Data

Jan. 8, 2016  (FR) .................................. 16 50165

(51) Int. Cl.
*G01B 9/02*   (2006.01)
*G03H 1/04*   (2006.01)
(Continued)

(52) U.S. Cl.
CPC .......... *G01B 9/02003* (2013.01); *G01B 9/02* (2013.01); *G01B 9/02041* (2013.01);
(Continued)

(58) Field of Classification Search
CPC .. G01B 9/02003; G01B 9/02; G01B 9/02041; G03H 1/0443; G03H 2001/0463;
(Continued)

(56) References Cited

U.S. PATENT DOCUMENTS 6,330,086 B1 * 12/2001 Collot .................. G03H 1/0005
                                                        359/28

FOREIGN PATENT DOCUMENTS

EP          1 043 632 A1    10/2000

OTHER PUBLICATIONS

Aridna Martinez-Marrades, Characterization of plasmonic nanoantennas by Holographic Microscopy and Scanning Near-field Microscopy, Nov. 9, 2015, Optics Communications, pp. 455-459 (Year: 2015).*

(Continued)

*Primary Examiner* — Michael P LaPage
(74) *Attorney, Agent, or Firm* — Baker & Hostetler LLP

(57) ABSTRACT

An optical detection device includes a light source emitting a light beam whose electromagnetic field, a means adapted to divide the beam into a first beam defining a first reference pathway and a second beam defining a second sample pathway, a modulation system frequency-shifting the electromagnetic fields of the two beams, a beam coupler adapted to collect the beams, an optical detection system adapted to detect the signal arising from the interference between the beams and coupled via the coupler, the sample being placed in the sample pathway, the optical detection system comprising an optical detector and a device adapted to measure the amplitude and the phase of the signal, an opaque screen (Continued)

comprising an optical aperture is placed at the level of a zone of a sample, in proximity to the sample, in the sample pathway.

16 Claims, 8 Drawing Sheets

(51) Int. Cl.
    *G01Q 30/02*     (2010.01)
    *G01R 29/08*     (2006.01)
    *G01Q 60/38*     (2010.01)

(52) U.S. Cl.
    CPC ......... *G01Q 30/02* (2013.01); *G01R 29/0892* (2013.01); *G03H 1/0443* (2013.01); *G01Q 60/38* (2013.01); *G03H 2001/0463* (2013.01); *G03H 2001/0469* (2013.01); *G03H 2001/0471* (2013.01); *G03H 2223/12* (2013.01)

(58) Field of Classification Search
    CPC ... G03H 2001/0469; G03H 2001/0471; G03H 2223/12; G01Q 30/02; G01Q 60/38; G01Q 60/18; G01Q 60/22; G01R 29/0892
    See application file for complete search history.

(56) References Cited

OTHER PUBLICATIONS

Edward Yoxall, Applications of Scattering-Type Scanning Near-Field Optical Microscopy in the Infrared, Oct. 2013, Imperial college London, pp. 1-129 (Year: 2013).*

Antonell Nesci, Measuring amplitude and phase in optical fields with sub-wavelength features, Nov. 2001, University of Neuchatel, pp. 1-104 (Year: 2001).*

Justin Gerber, Real-Time Detection for Scattering Scanning Near-Field Optical Microscopy, 2013, University of Colorado, pp. 1-65 (Year: 2013).*

Dandliker, et al., "Measuring optical phase singularities at subwavelength resolution", Journal of Optics, A, Pure and Applied Optics, Institute of Physics Publishing, vol. 6, No. 5, pp. S189-S196, May 1, 2004.

Clerc, et al., "Numerical heterodyne holography with two-dimensional photodetector arrays", Optics Letters, Optical Society of America, vol. 25, No. 10, pp. 716-718, 2000.

Atlan, et al., "Heterodyne holographic microscopy of gold particles", Optics Letters, vol. 33, No. 5, pp. 500-502, 2008.

Celebrano, et al., "Hollow-pyramid based scanning near-field optical microscope coupled to femtosecond pulses: A tool for nonlinear optics at the nanoscale", Review of Scientific Instruments, vol. 80, Issue 3, Mar. 20, 2009.

Hosaka, et al., "SNOM imaging of very fine pits formed by EB lithography for ultrahigh density optical recording", Microelectronic Engineering, vols. 67-68, pp. 728-735, Jun. 1, 2003.

Laforest, et al., "Co-integration of a smart CMOS image sensor and a spatial light modulator for real-time optical phase modulation", Proc. SPIE 9022, The International Society for Optical Engineering, Mar. 4, 2014.

Martinez-Marrades, et al., "Characterization of plasmonic nanoantennas by Holographic Microscopy and Scanning Near-field Microscopy", Optics Communications, vol. 359, pp. 455-459, Jan. 1, 2016.

* cited by examiner

SNOM DEVICE USING HETERODYNE DETECTION

CROSS-REFERENCE TO RELATED APPLICATIONS

This application is a National Stage of International patent application PCT/FR2017/050041, filed on Jan. 6, 2017, which claims priority to foreign French patent application No. FR 1650165, filed on Jan. 8, 2016, the disclosures of which are incorporated by reference in their entirety.

FIELD OF THE INVENTION

The present invention relates to devices for imaging the electromagnetic field present in proximity to the surface of a sample.

BACKGROUND

More particularly, the invention pertains to an optical detection device for characterizing in terms of amplitude and phase the electromagnetic field of a zone of a sample, the device comprising a light source adapted to emit a light beam whose electromagnetic field has an angular frequency $\omega$, a means adapted to divide the beam into a first beam defining a first pathway, termed the reference pathway, and a second beam defining a second pathway, termed the sample pathway, a modulation system which frequency-shifts the electromagnetic fields of the two beams by a frequency $\delta$, a beam coupler adapted to collect the beams arising from the two pathways, an optical detection system adapted to detect the signal arising from the interference between the beams arising from the two pathways and coupled via said beam coupler.

The document "Numerical heterodyne holography with two-dimensional photodetector arrays" F. Le Clerc & co., Optics letters, describes an example of such an optical detection device using heterodyne detection to characterize in terms of amplitude and phase the electromagnetic field which passes through a sample, by a heterodyne numerical holography technique.

However, such a device requires the use of a matrix detector, thereby limiting the range of wavelengths in which the measurements can be carried out. The spatial resolution of such a device is moreover limited by the wavelength used.

SUMMARY OF THE INVENTION

The aim of the present invention is in particular to alleviate these drawbacks.

For this purpose, according to the invention, a device of the kind in question is characterized in that the sample is placed in the sample pathway, the optical detection system comprises an optical detector and a device adapted to measure the amplitude and the phase of the signal, an opaque screen comprising an optical aperture is placed at the level of the zone in the sample pathway, in proximity to the sample.

By virtue of these provisions, the characterization of the field in terms of amplitude and phase will be obtainable with a spatial resolution which will depend only on the size of the optical aperture and which will be independent of the wavelength.

Very good spatial resolution will in particular be obtainable. Moreover such a device will be able to be used over an extended spectral range. The amplitude of the signal will be able to be amplified by such a device, which will be particularly beneficial in the case of a signal of interest of low amplitude.

In preferred embodiments of the invention, it is optionally possible to have recourse furthermore to one and/or to the other of the following provisions:
   the light source is the sample itself, and the sample is also the means adapted to split the beam;
   the light source, the means adapted to split the beam and the sample are three distinct elements, said second sample pathway comprising the sample;
   the means adapted to split the beam is a beam splitter;
   the device adapted to measure the amplitude and the phase of the signal is a synchronous-detection device;
   the modulation system comprises a first modulation means, one or the other of said first reference pathway or of said second sample pathway comprises said first modulation means, said first modulation means being adapted to frequency-modulate the field of said first beam or second beam respectively, the first modulation means being adapted to implement the frequency shift $\delta$ between the respective frequencies of the fields corresponding to the beams of each of the two pathways;
   the modulation system comprises a first modulation means, said first reference pathway comprises said first modulation means, said first modulation means being adapted to frequency-modulate the field of the first beam, and also a second modulation means, said second sample pathway comprising said second modulation means, said second modulation means being adapted to frequency-modulate the field of the second beam, the first and second modulation means being adapted to implement the frequency shift $\delta$ between the respective frequencies of the fields corresponding to the beams of each of the two pathways;
   said second modulation means precedes the sample in the order of progression of the beam of the sample pathway;
   the sample and the optical aperture of the opaque screen are adapted to be displaced with respect to one another;
   the sample is mounted on a displacement system adapted to displace the sample with respect to the fixed optical aperture;
   the displacement system is a piezo-electric system;
   the optical aperture is an empty zone of the opaque screen;
   the optical aperture is a zone of the opaque screen, which zone is transparent at the frequency $\omega/2\pi$;
   the device is geometrically arranged so that the second beam passes through the sample and the opaque screen in an arbitrary order, in its journey toward the collection system, the device being geometrically arranged so that the first and the second beam can be collected at the level of the beam coupler;
   the device is geometrically arranged so that the second beam reflects at the surface of the sample and passes through the opaque screen in an arbitrary order before heading toward the collection system, the device being geometrically arranged so that the first and the second beam can be collected at the level of the beam coupler;
   the optical detector is a single-channel detector;
   the optical aperture is installed at the end of the tip of the cantilever of an atomic force microscope.

The invention also pertains to an optical detection method for characterizing in terms of amplitude and phase the electromagnetic field of a zone of a sample, said method comprising the following steps of emitting a light beam whose electromagnetic field has an angular frequency ω, of dividing the beam into a first beam defining a first pathway, termed the reference pathway, and a second beam defining a second pathway, termed the sample pathway, of placing on the sample pathway a sample and an opaque screen comprising an optical aperture placed at the level of the zone in proximity to the sample, of frequency-shifting the electromagnetic fields of the two beams by a frequency δ, of collecting the beams arising from the two pathways, of detecting the signal arising from the interference between the beams arising from the two pathways and coupled via said beam coupler, of deducing the amplitude and the phase of the electromagnetic field of a zone of the sample.

Other characteristics and advantages of the invention will become apparent in the course of the following description, given by way of nonlimiting example, of one of its embodiments, with regard to the attached drawings.

DETAILED DESCRIPTION

Figure 1A:
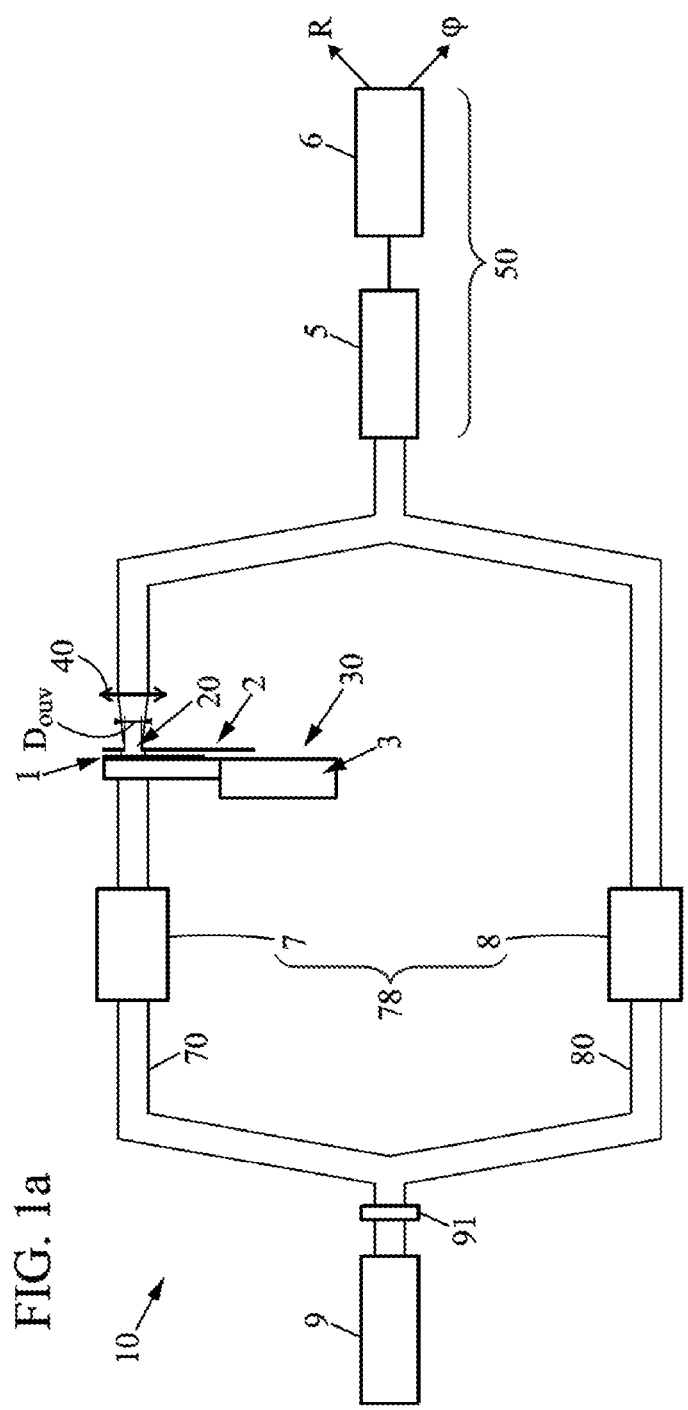
FIG. 1a illustrates the principle of the invention.

In the various figures, the same references designate identical or similar elements.

In the device 10 of the invention, an incident light beam is split into two light beams traveling along two different pathways 70, 80, the two signals being phase-shifted by a known frequency, a single one of the two signals impacting the sample 1 to be imaged. The sample is placed in the sample pathway 70. The sample 1, held by a sample holder 30, is placed opposite an opaque screen 2 of size greater than the wavelength and comprising an optical aperture 20, said screen effectively blocking the light around the optical aperture, only the light passing through the optical aperture reaching the detection system. The signals arising from the two pathways interfere thereafter and the interference signal is detected by a detection system 50 adapted to deduce from the interference signal the image of the amplitude and of the phase of the electromagnetic field present in proximity to the zone, placed facing the optical aperture 20, of the sample 1. The sample 1 and the opaque screen 2 are displaced with respect to one another so that various zones of the sample 1 are successively placed opposite the optical aperture 20 of the opaque screen 2 and imaged. The spatial selection of the zone to be imaged by the optical aperture 20 in the opaque screen 2 makes it possible to spatially resolve the image of the sample 1, that is to say to identify the sample 1 zone to which the measured amplitude and measured phase should be allocated. This may entail for example the displacement of the sample holder 30 with respect to the fixed screen 2 or the displacement of the screen 2 with respect to the fixed sample holder 30. Throughout what follows it will be considered that the screen 2 is fixed and that the sample holder 30 displaces the sample 1 (the sample holder is therefore the displacement system 3).

The opaque screen 2 will be able to be placed before or after the sample 1 in the order of progression of the second beam of the second sample pathway 70. Throughout what follows, the case will be considered where the sample 1 is placed before the screen 2 in the order of progression of the second beam. The second beam and the aperture will have to be at least coarsely aligned, in particular if the beam is narrow.

More precisely as illustrated in FIG. 1a, on exiting a source 9, the incident light beam is split into two pathways 70, 80 by a means adapted to divide the beam 91. A modulation system 78 implements a frequency shift δ (temporal beat at the frequency δ between the two pathways) between the fields of the beams which travel along each pathway.

The modulation system 78 comprises for example modulation means 7, 8 positioned on each of the pathways 70, 80 respectively. These modulation means 7, 8 implement a frequency shift δ (temporal beat at the frequency δ between the two pathways) between the fields of the beams which travel along each pathway. In the case where the optical field arising from the source has an angular frequency ω and where the modulation means 7, 8 modulate the fields of the reference pathway 80 and of the pathway comprising the sample, termed the sample pathway 70, respectively at the frequencies f and f+δ, the field in the sample pathway 70 is for example of the form:

$$E_{ech}e^{i((\omega+2\pi f+2\pi\delta)t+\varphi_{ech})}$$

With $E_{ech}$ the amplitude of the field in the sample pathway 70 and $\varphi_{ech}$ the phase of the field in the sample pathway 70.

The field in the reference pathway is for example of the form:

$$E_{ref}e^{i((\omega+2\pi f)t+\varphi_{ref})}$$

With $E_{ref}$ the amplitude of the field in the reference pathway 80 and $\varphi_{ref}$ the phase of the field in the reference pathway 80.

Heterodyne detection consists in making the light beam of interest which impacted the sample interfere on the optical detector 5 with a second light beam which traverses the reference pathway, and then in determining the amplitude and the phase with the aid of an oscilloscope or of slow acquisition systems.

The intensity I on exiting the detector 5 therefore corresponds to the interference of these two signals and has the form:

$$I \propto |E_{ech}e^{i((\omega+2\pi f+2\pi\delta)t+\varphi_{ech})}+E_{ref}e^{i((\omega+2\pi f)t+\varphi_{ref})}|^2$$

$$I \propto |E_{ech}|^2+|E_{ref}|^2+2E_{ech}*E_{ref}\cos(2\pi\delta t+\varphi_{ech}-\varphi_{ref})$$

By demodulating the intensity with the aid of a synchronous-detection device 6 at the frequency δ on exiting the detector 5, are extracted the amplitude R and the phase φ of the field which passes through the sample, which are given by the following expressions:

$$R \propto |E_{ref}||E_{ech}|$$

$$\varphi=\varphi_{ech}-\varphi_{ref}+cst$$

The amplitude R is proportional to the amplitude of the detected field which passes through the sample 1 and the phase φ is equal to within an additive constant, $(-\varphi_{ref}+cst)$, where cst is a constant, to the phase $\varphi_{ech}$ of the field studied.

This information is therefore local since it is restricted to the light which passes into the optical aperture, the remainder being blocked by the screen. The screen pierced with an optical aperture is for example a cantilever with an optical aperture.

As an alternative to synchronous detection the amplitude and the phase will be able to be obtained by multiplying the signal to be analyzed by a known signal of the same frequency for example with the aid of an oscilloscope or of a sufficiently fast analog-digital converter.

As a variant, the modulation system 78 may comprise only a first modulation means 8. One or the other of said first reference pathway 80 or of said second sample pathway 70 comprises said first modulation means 8, said first modulation means 8 being adapted to frequency-modulate the field of said first beam or second beam respectively. The first modulation means 8 is adapted to implement the frequency shift δ between the respective frequencies of the fields corresponding to the beams of each of the two pathways.

The opaque screen 2 comprising the aperture 20 can be displaced with respect to the sample 1 so as to select a zone to be imaged. A displacement system 3 allows a relative displacement of the sample 1 with respect to the opaque screen 2. Collection systems 40 make it possible to collect the light beams on either side of the opaque screen 2. For example, the sample 1 is displaced and the aperture 20 and the beam in the sample pathway 70 are aligned. The aperture 20 will have a dimension which is substantially less than the dimension of the beam which illuminates the sample 1.

The displacement makes it possible to access the spatial variations of the amplitude and phase parameters of the electromagnetic field with a resolution which depends only on the size of the aperture 20 and not the wavelength.

Figure 2:
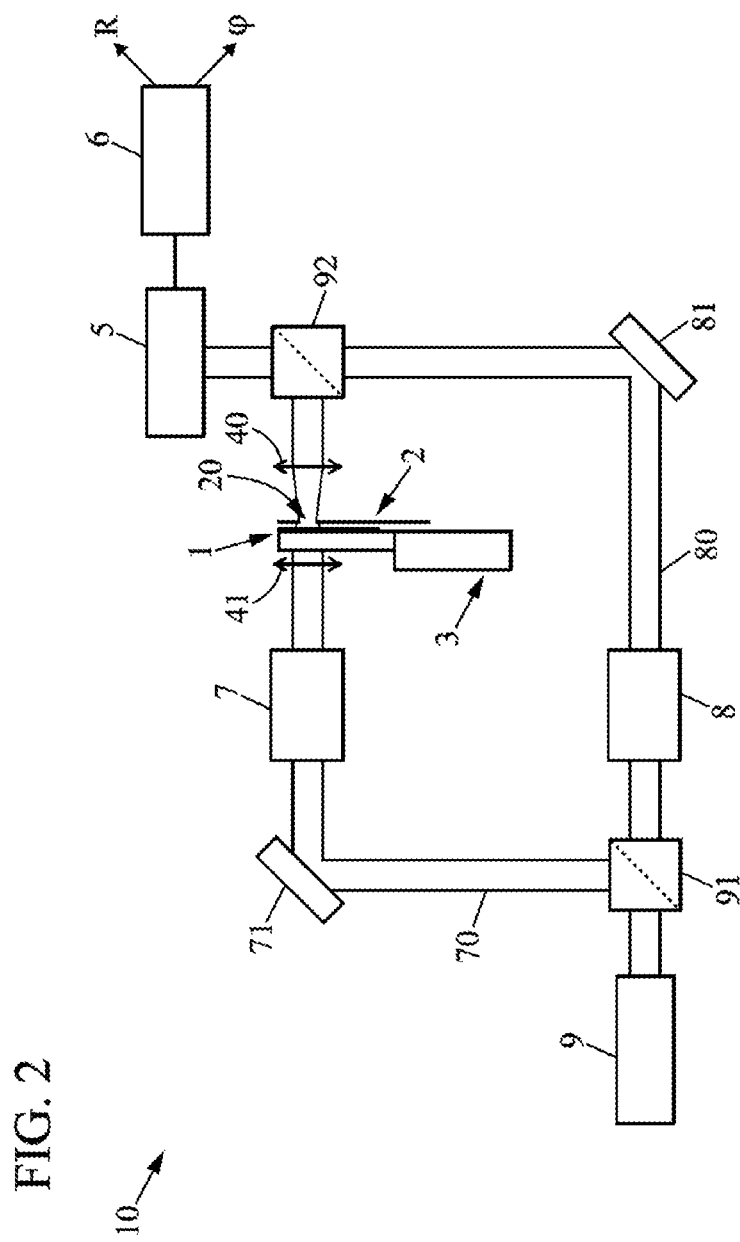
FIG. 2 illustrates the first embodiment of the invention.

As illustrated in FIG. 2, the means adapted to divide the beam 91 can be a beam splitter through which the light beam arising from the source is sent. Mirrors positioned along the journey of the light beam can make it possible to orient the beams of each of the pathways. The modulation means used 7, 8 may be modulators, in particular acousto-optical modulators, but also other types of modulators such as amplitude, phase or Mach-Zehnder modulators. The frequency f is for example 80 MegaHertz (MHz) and the frequency shift δ is for example 1 KiloHertz (kHz). Collection systems can be placed on the trajectory of the light beam in the sample pathway 70, the collection systems being adapted to give a direction to the dispersed beam before it passes through the sample, or on exiting the aperture 20 in its trajectory toward the detector. The source may for example be a laser source. The collection systems are for example lenses 40. The detector is for example a photodiode or for example a single-channel detector.

Figure 1B:
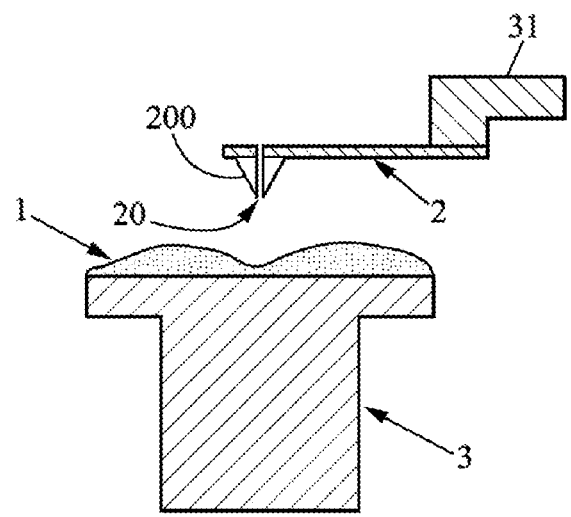
FIG. 1b illustrates the case where the device is integrated into an AFM tip.

The light beams arising from the two pathways 70 and 80 can be recombined via a beam coupler 92. The sample 1 is undergoing displacement with respect to the opaque screen 2 comprising an aperture 20, via a displacement system 3 on which is installed the sample 1 (this entails the sample holder 30). The translation system is for example a piezo-electric system. As a variant the translation system can be a system of translation stages equipped with electric motors, in particular for applications to long wavelengths such as microwave applications. The aperture 20 in the opaque screen has in particular a diameter $D_{ouv}$, this may entail a hole or a zone which is transparent or translucent at the frequency of the electromagnetic field of interest. The opaque screen is for example a spar pierced with an aperture. The size of the aperture may be smaller than the wavelength for example. The aperture may for example be installed at the end of the tip 200 of the cantilever 2 of an atomic force microscope (AFM) as illustrated in FIG. 1b. The aperture is made by passing through at one and the same time the tip 200 and the cantilever 2, so that the light situated at the end of the tip 200 can pass right through the tip 200 and the cantilever 2. This technique can be coupled with a technique of local scanning probe 31 in the case of an AFM cantilever for example.

In the case of an aperture of sub-wavelength size ($D_{ouv} < \lambda$) made at the end of the tip of an AFM, the scanning of the tip in the near-field zone on the surface of the sample (aperture at a distance d from the sample such that $d < \lambda$ for access to the near-fields) gives access to super-resolved images of the amplitude and of the phase of the near-field on the surface of the sample. In this case, the intensity of the beam of interest may be very low since the light must pass through an aperture of smaller size than its wavelength. The heterodyne measurement will play a significant role of amplifying the optical beam of interest. Heterodyne amplification consists in making the beam of interest, of very low intensity, interfere on the optical detector via the beam coupler 92 with the reference beam of much greater intensity. The coherence between these optical signals makes it possible to amplify the beam of interest by a factor which is given by the ratio of the amplitude of the reference beam to the amplitude of the beam of interest, thus rendering the latter more easily measurable, while giving access to its amplitude and to its phase. The sample 1 is not subjected to any vibration.

In the four embodiments which will follow, said second modulation means 7 precedes the sample 1 in the order of progression of the beam of the sample pathway 70.

In a first embodiment, the device 10 is mounted in free space. In the case illustrated in FIG. 2, the laser 9 emits a light beam which is split by the beam splitter 91 into two light beams corresponding to the two pathways:

the reference pathway 80, in which the beam passes through a first modulator 8, which modulates the field of the beam which passes through it at the frequency f, and then is reflected by a first mirror 81 in the direction of the beam coupler 92, the sample pathway 70 comprising a second mirror 71, the beam being reflected by said second mirror 71 so as thereafter to pass through the second modulator 7, which modulates the field of the beam at the frequency f+δ, the beam thereafter passing through a first collection system 41, and then the beam passes through the sample 1, the beam having a direction substantially perpendicular to the direction in which the sample 1 extends, the beam arising from the aperture 20 of the opaque screen opposite the sample passing through a second collection system 40 so as to be collected by the beam coupler 92.

The beams arising from the sample pathway 70 and from the reference pathway 80 interfere and the interference signal is collected by the detector 5. The detected signal is transmitted to the synchronous-detection device 6 which is adapted to extract the phase φ and the modulus R according to the physical principle of heterodyne detection, explained hereinabove. In particular, the journey of the beam which arrives at the sample 1 and which leaves the aperture 20 of the opaque screen takes place in free space.

As a variant of this embodiment, the opaque screen comprising an aperture 2 can be placed "before" the sample, i.e. the beam arising from the modulator 7 passes firstly through the opaque screen comprising the aperture 20 before passing through the sample.

In this embodiment of the device 10, the system operates with a translucent sample. The displacement system 3 must be at least partially translucent also to allow the beam to pass through.

Figure 3:
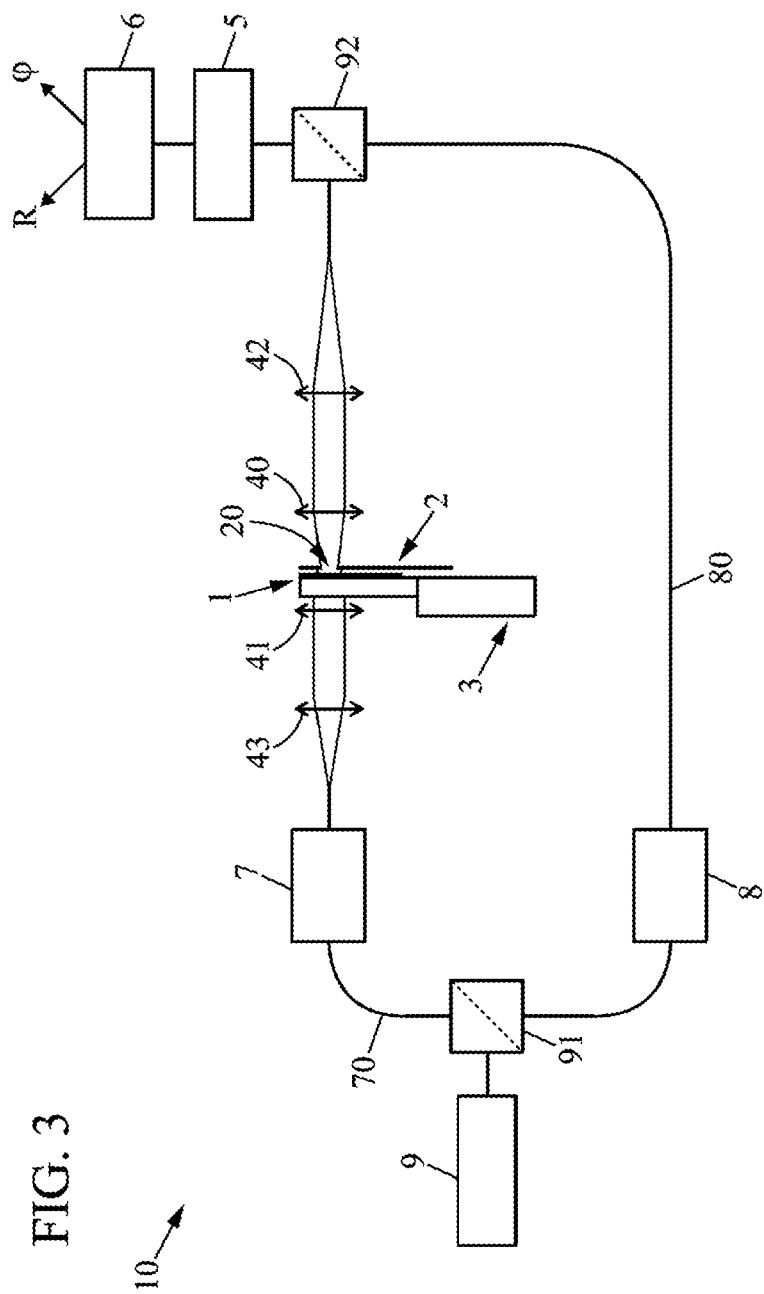
FIG. 3 illustrates the second embodiment of the invention.

In a second embodiment, illustrated in FIG. 3, the device 10 is in a partially fibered version, that is to say that the architecture of the device 10 is analogous to the previous embodiment, but a part of the light beams in each pathway are transmitted by cables. In particular, the journey of the beam which arrives at the sample 1 and which leaves the aperture 20 of the opaque screen takes place in free space.

As a variant of this embodiment, the opaque screen comprising an aperture 20 can be placed "before" the sample, i.e. the beam arising from the modulator 7 passes firstly through the opaque screen comprising the aperture 20 before passing through the sample.

In this embodiment of the device 10, the system operates with a translucent sample. The displacement system 3 must be at least partially translucent also to allow the beam to pass through.

Figure 4:
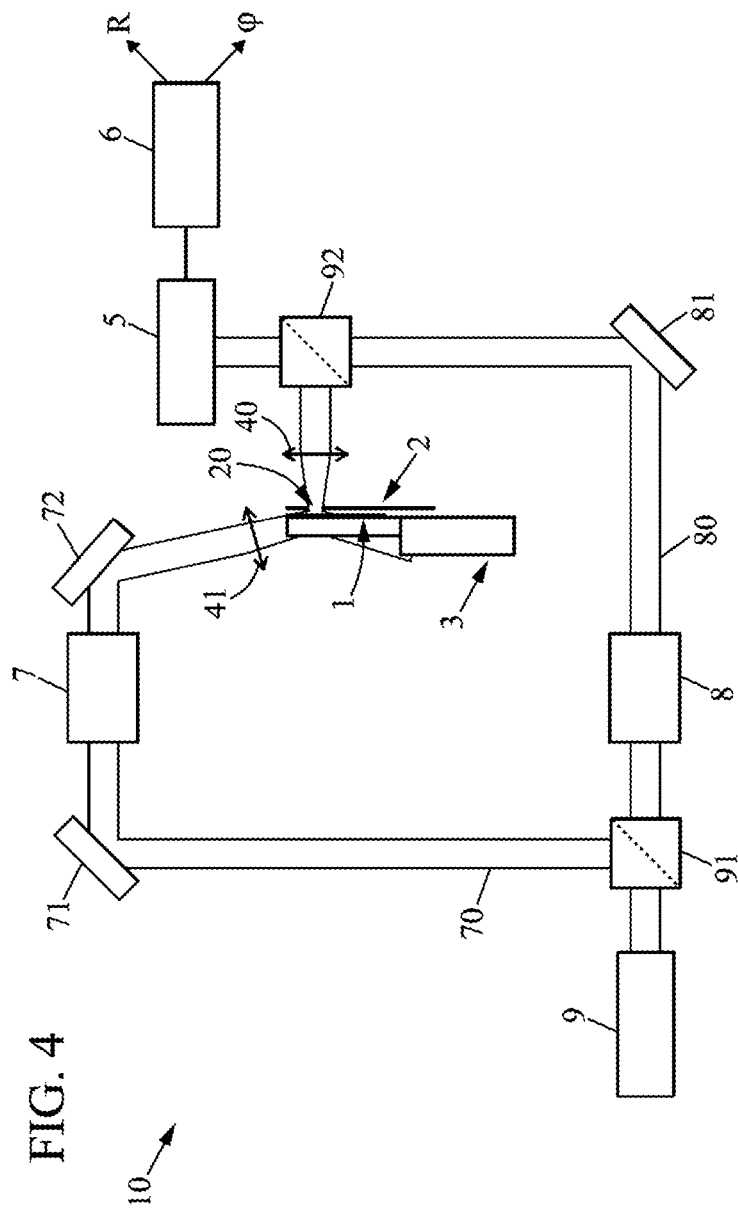
FIG. 4 illustrates the third embodiment of the invention.

In a third embodiment illustrated in FIG. 4, the source 9 emits a light beam which is split by the beam splitter 91 into two light beams corresponding to the two pathways:
  the reference pathway 80, in which the beam passes through a first modulator 8, which modulates the field of the beam which passes through it at the frequency f, and then is reflected by a first mirror 81 in the direction of the second beam splitter 92,
  the sample pathway 70 comprising a second mirror 71, the beam being reflected by said second mirror 71 so as thereafter to pass through the second modulator 7, which modulates the field of the beam at the frequency f+δ, the beam thereafter being again reflected by a third mirror 72, the beam thus reflected having a direction almost parallel to the direction of extension of the sample 1 (oblique incidence of the beam, the electromagnetic field scattered at the level of the aperture 20 passing through the latter), the beam thereafter passing through a first collection system 41 and then the sample 1 so as to be partially transmitted in the direction substantially perpendicular to the sample 1 and partially reflected by the sample 1, the beam arising from the aperture 20 of the opaque screen 2 opposite the sample thereafter passing through a second collection system 40 so as to be collected by the beam coupler 92.

The beams arising from the sample pathway 70 and from the reference pathway 80 interfere and the interference signal is collected by the detector 5. The detected signal is transmitted to the synchronous-detection device 6 which is adapted to extract the phase φ and the modulus R according to the principle of heterodyne detection, explained hereinabove. Such a configuration may in particular be apparent in the case of integrated waveguide, the field then being only an areal field and the injection being done laterally at the level of the entrance of the guide.

In this embodiment of the device 10, the system operates with a translucent sample. The displacement system 3 must be at least partially translucent also to allow the beam to pass through. In particular, the journey of the beam which arrives at the sample 1 and which leaves the aperture 20 of the opaque screen takes place in free space.

Figure 5:
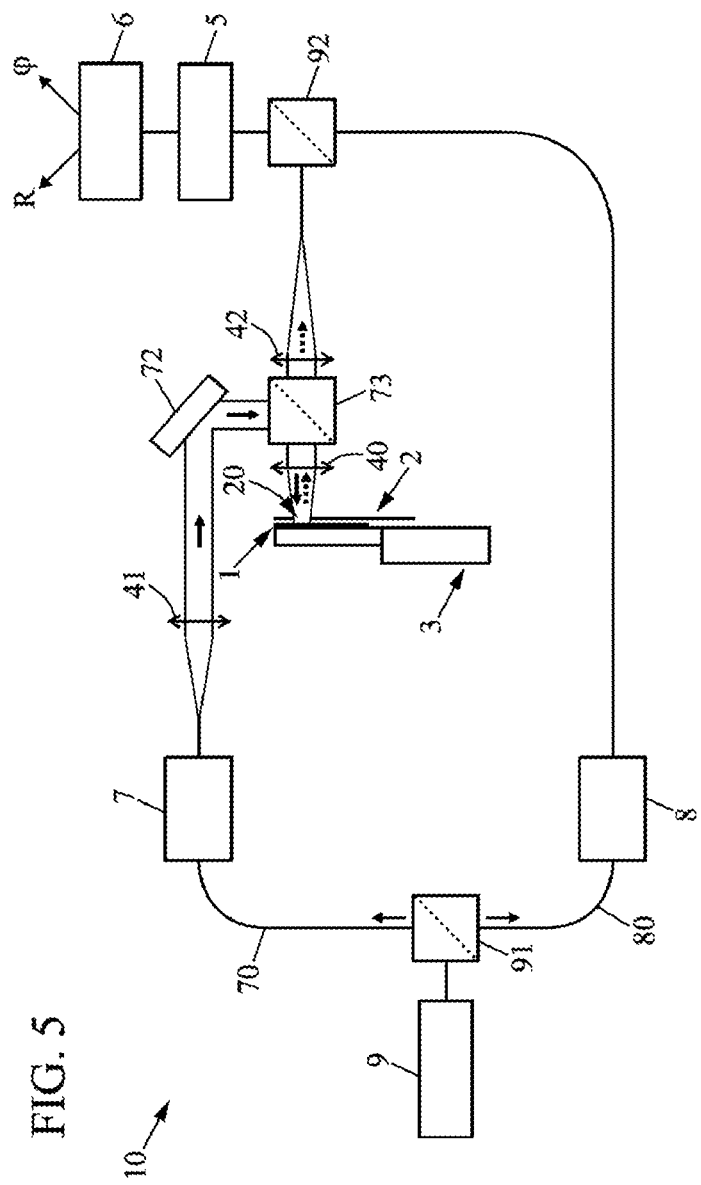
FIG. 5 illustrates the fourth embodiment of the invention.

In a fourth embodiment illustrated in FIG. 5, in the case of a partially fibered version like that of the second embodiment, the laser 9 emits a light beam which is split by the beam splitter 91 into two light beams corresponding to the two pathways:
  the reference pathway 80, in which the beam passes through a first acousto-optical modulator 8, which modulates the field of the beam which passes through it at the frequency f, and then is guided toward the beam coupler 92,
  the sample pathway 70 in which the beam is guided toward the second acousto-optical modulator 7, which modulates the field of the beam at the frequency f+δ, the beam thereafter being reflected by a mirror 72, the beam thus reflected being collected by a second beam splitter 73, the second beam splitter 73 being adapted to split the beam into a beam directed toward the sample 1 in a direction substantially perpendicular to the direction of extension of the sample 1, said beam being reflected by the sample, the reflected beam being re-collected by the second beam splitter 73, and into a beam transmitted directly toward the beam coupler 92, the set of beams arising from the second beam splitter 73 being collected by the beam coupler 92.

In this embodiment, collection systems 40, 41, 42 can be used to collect the beam on its journey, in particular a collection system 41 for its arrival at the mirror 72, a collection system 40 for its passage between the second beam splitter 73 and the sample 1 and a collection system 42 for its journey on exiting the second beam splitter 73.

The beams arising from the sample pathway 70 and from the reference pathway 80 and collected by the beam coupler 92 interfere and the interference signal is collected by the detector 5. The detected signal is transmitted to the device 6 adapted to extract the phase φ and the modulus R, according to the principle of heterodyne detection, explained hereinabove. This entails for example a synchronous-detection device.

In this embodiment of the device 10, the system operates in retro-reflected mode, that is to say it operates in particular on an opaque sample. In particular, the journey of the beam which arrives at the sample 1 and which leaves the aperture 20 of the opaque screen takes place in free space.

As a variant of this embodiment, the beam incident on the sample could also have an oblique incidence on the sample 1.

Figure 6:
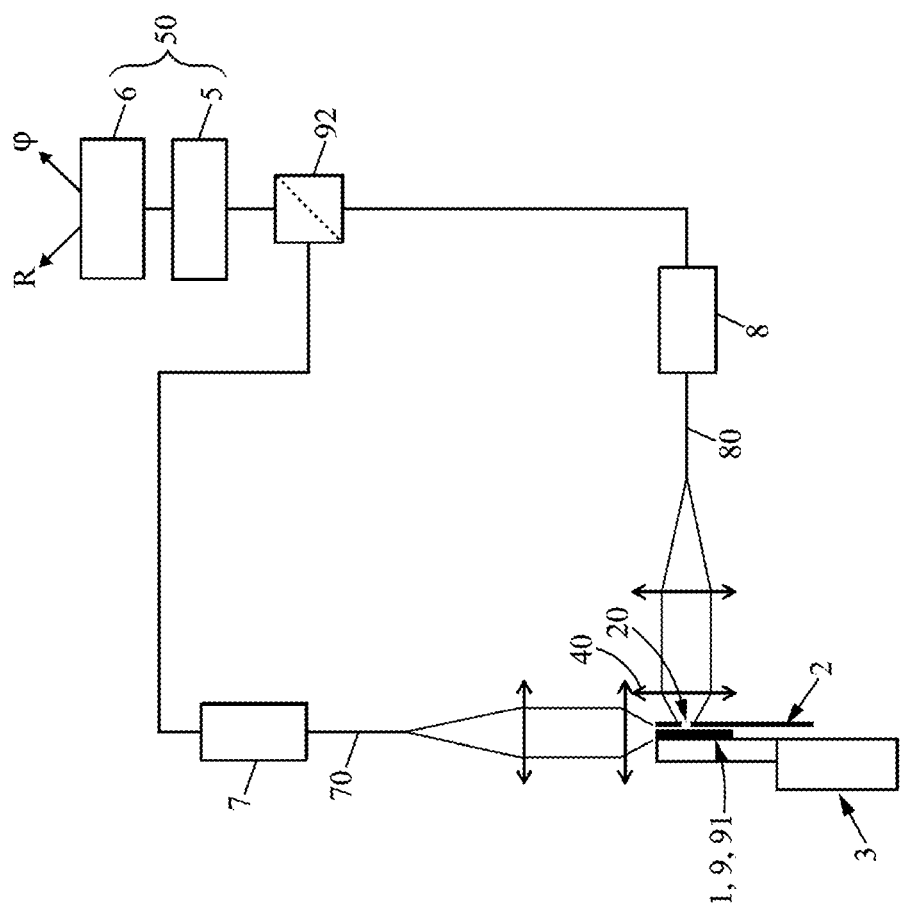
FIG. 6 illustrates the fifth embodiment of the invention.

In a fifth embodiment illustrated in FIG. 6, the light source 9 is the sample 1 itself, and the sample 1 is also the means adapted to split the beam 91. The sample 1 may for example be a semi-conductor laser, and is then a source of radiation. The semi-conductor laser emits a propagative field through its end, in the pathway termed the reference pathway 80 and the electromagnetic field is measured on its surface in the pathway termed the sample pathway 70. In particular, the journey of the beam which arrives at the sample 1 and which leaves the aperture 20 of the opaque screen takes place in free space.

Figure 7:
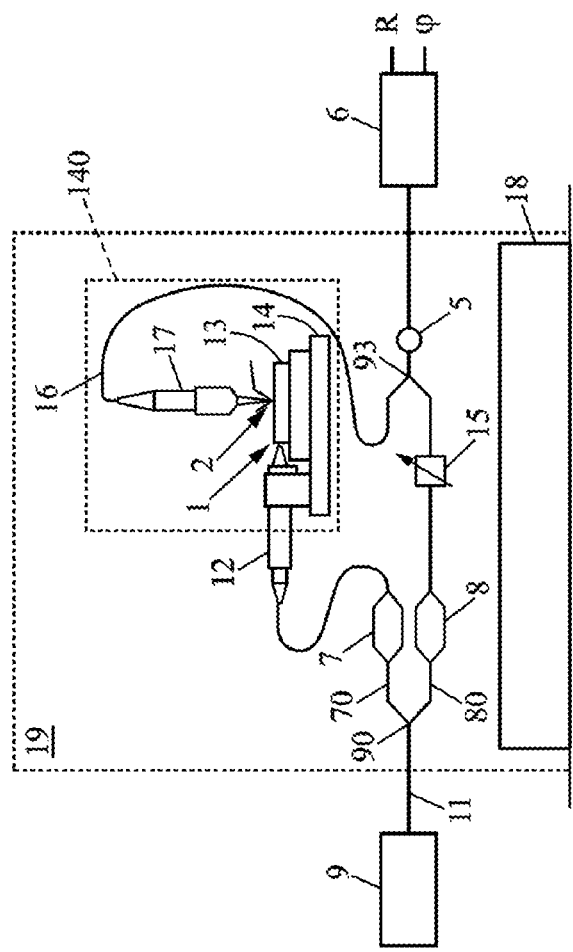
FIG. 7 illustrates a practical realization of the invention.

FIG. 7 illustrates a practical realization of the invention suitable for studying the amplitude and the phase of the field on the surface of a passive waveguide whose injection takes place in a lateral manner with the aid of a micro-lensed fiber. The device 10 comprises an SNOM microscope comprising a piezoelectric stage and a probe with tip with aperture on cantilever 17. A tunable laser source 9 emits a monochromatic beam of arbitrarily fixed wavelength of between 1490 nm and 1650 nm, coupled in a single-mode fiber 11. A fibered coupler 90 makes it possible to split the beam into two pathways, the sample pathway 70 and the reference pathway 80. A fibered acousto-optical modulator present on each pathway 7, 8, makes it possible to induce a temporal beat between the two pathways of frequency δ. A micro-lensed fiber 12 is connected to the sample pathway, as beam collection system, in such a way as to focus the beam in the entrance of the sample that is to say of the passive waveguide 13. The waveguide 13 is placed on the piezoelectric stage 14 which plays the role of displacement system. The probe 17, which plays the role of the opaque screen with aperture, transmits a signal detected on the surface of the sample due to the transmission through the nano-aperture of the evanescent portion of the field which propagates in the passive waveguide 13. This signal transmitted in free space above the nano-aperture is collected by an objective with large numerical aperture and then focused on an optical fiber 16, recombined with the reference pathway with the aid of a second fibered coupler 93. The result signal is thereafter sent to a fibered detector 5 where the reference field and the field which passes through the sample transmitted by the nano-aperture interfere. According to the general principle of the invention, the voltage delivered by the detector is thereafter demodulated with the aid of a synchronous detection at the frequency δ, so as to obtain an amplitude proportional to the amplitude of the field probed by the scanning probe and a phase equal to within an additive constant to the phase of this probed field.

The waveguide is for example a silica guide on a silicon substrate of smaller transverse dimensions than the wavelength (transverse cross section 200×500 nm$^2$).

The phase φ to which access is gained in addition to the amplitude measurement advises about the optical path and simultaneously affords information about the index of the medium and the distance traveled. In scattering problems, in particular with variations of distances traveled, the measurements of amplitude R and of phases φ make it possible to access the scattering matrix of the sample linking the modes of input and of output of the electromagnetic field. In the case of resonating systems, the phase φ will also be able to reveal information about the nature of the oscillator (plasmonic or cavity-type).

The invention claimed is:

1. An optical detection device for characterizing in terms of amplitude and phase the electromagnetic field of a zone of a sample, the device comprising:
    a light source adapted to emit a light beam whose electromagnetic field has an angular frequency ω,
    a beam splitter adapted to divide the beam into a first beam defining a first pathway, termed the reference pathway, and a second beam defining a second pathway, termed the sample pathway,
    a modulation system which frequency-shifts the electromagnetic fields of the two beams by a frequency δ,
    a beam coupler adapted to collect the beams arising from the two pathways,
    an optical detection system adapted to detect the signal arising from the interference between the beams arising from the two pathways and coupled via said beam coupler, wherein:
    the sample is placed in the sample pathway,
    the optical detection system comprises an optical detector and a device adapted to measure the amplitude and the phase of the signal,
    an opaque screen comprising an optical aperture is placed in alignment with the zone in the sample pathway, in the near-field region optically downstream from the sample,
    at least one collection system adapted to collect the first and second beams, placed at least on one side of the opaque screen, the light beams propagating in free space at least in a journey between the optical aperture and the collection system.

2. The device as claimed in claim 1, wherein the means adapted to split the beam is a beam splitter.

3. The device as claimed in claim 1, wherein the device adapted to measure the amplitude and the phase of the signal is a synchronous-detection device.

4. The device as claimed in claim 1, wherein the modulation system comprises a first modulation means, one or the other of said reference pathway or of said sample pathway comprises said first modulation means, said first modulation means being adapted to frequency-modulate the field of said first beam or second beam respectively, the first modulation means being adapted to implement the frequency δ between the respective frequencies of the fields corresponding to the beams of each of the two pathways.

5. The device as claimed in claim 1, wherein the modulation system comprises a first modulation means, said reference pathway comprises said first modulation means, said first modulation means being adapted to frequency-modulate the field of the first beam, and also a second modulation means, said sample pathway comprising said second modulation means, said second modulation means being adapted to frequency-modulate the field of the second beam, the first and second modulation means being adapted to implement the frequency shift δ between the respective frequencies of the fields corresponding to the beams of each of the two pathways.

6. The device as claimed in claim 5, wherein said second modulation means precedes the sample in the order of progression of the beam of the sample pathway.

7. The detection device as claimed in claim 1, wherein the sample and the optical aperture of the opaque screen are adapted to be displaced with respect to one another.

8. The device as claimed in claim 7, wherein the sample is mounted on a displacement system adapted to displace the sample with respect to the fixed optical aperture.

9. The device as claimed in claim 8, wherein the displacement system is a piezo-electric system.

10. The device as claimed in claim 1, wherein the optical aperture is an empty zone of the opaque screen.

11. The device as claimed in claim 1, wherein the optical aperture is a zone of the opaque screen, which is transparent at the frequency ω/2π.

12. The device as claimed in claim 1, geometrically arranged so that the second beam passes through the sample, the device being geometrically arranged so that the first and the second beam are collected in proximity of the beam coupler.

13. The device as claimed in claim 1, geometrically arranged so that the second beam reflects at the surface of the sample, the device being geometrically arranged so that the first and the second beam are collected in proximity of the beam coupler.

14. The device as claimed in claim 1, wherein the optical detector is a single-channel detector.

15. The device as claimed in claim 1, wherein the optical aperture is installed at the end of a tip of the cantilever of an atomic force microscope.

16. An optical detection method for characterizing in terms of amplitude and phase the electromagnetic field of a zone of a sample, said method comprising the following steps:
    emitting a light beam whose electromagnetic field has an angular frequency ω,
    dividing the beam into a first beam defining a first pathway, termed the reference pathway, and a second beam defining a second pathway, termed the sample pathway,
    placing on the sample pathway a sample and an opaque screen comprising an optical aperture placed in alignment with the zone in the near-field region optically downstream from the sample,
    frequency-shifting the electromagnetic fields of the two beams by a frequency δ, collecting the first and second beams arising from the two pathways, the beam arising from the sample pathway propagating in free space at least in a journey between the optical aperture and a collection system placed on the sample pathway, detecting the signal arising from the interference between the beams arising from the two pathways and coupled via a beam coupler, deducing the amplitude and the phase of the electromagnetic field of a zone of the sample.

* * * * *